United States Patent
Ali et al.

(10) Patent No.: US 7,728,752 B2
(45) Date of Patent: Jun. 1, 2010

(54) RESIDUE GENERATORS FOR REDUCTION OF CHARGE INJECTION IN PIPELINED CONVERTER SYSTEMS

(75) Inventors: Ahmed Mohamed Abdelatty Ali, Oak Ridge, NC (US); Gregory W. Patterson, Jamestown, NC (US)

(73) Assignee: Analog Devices, Inc., Norwood, MA (US)

( * ) Notice: Subject to any disclaimer, the term of this patent is extended or adjusted under 35 U.S.C. 154(b) by 22 days.

(21) Appl. No.: 12/291,262

(22) Filed: Nov. 5, 2008

(65) Prior Publication Data

US 2010/0109927 A1 May 6, 2010

(51) Int. Cl.
H03M 1/38 (2006.01)
(52) U.S. Cl. .................. 341/161; 341/118; 341/120; 341/155; 341/162; 341/172
(58) Field of Classification Search ................. 341/118, 341/120, 155, 161, 162, 172
See application file for complete search history.

(56) References Cited

U.S. PATENT DOCUMENTS

| | | | | |
|---|---|---|---|---|
| 5,180,932 | A | | 1/1993 | Bengel .................. 307/353 |
| 5,574,457 | A | * | 11/1996 | Garrity et al. .............. 341/172 |
| 5,923,206 | A | | 7/1999 | Levinson .................. 327/362 |
| 6,172,629 | B1 | | 1/2001 | Fetterman .................. 341/131 |
| 6,545,628 | B1 | | 4/2003 | Aram .................... 341/155 |
| 6,559,787 | B1 | | 5/2003 | Aude et al. ................. 341/161 |
| 6,600,440 | B1 | * | 7/2003 | Sakurai .................... 341/172 |
| 6,756,929 | B1 | * | 6/2004 | Ali ........................... 341/161 |
| 6,801,151 | B1 | * | 10/2004 | Opris ........................ 341/161 |
| 6,954,169 | B1 | * | 10/2005 | Min .......................... 341/172 |
| 6,967,611 | B2 | | 11/2005 | Atriss et al. ................. 341/172 |
| 6,970,038 | B2 | | 11/2005 | Chandrasekaran ............ 330/9 |
| 7,002,505 | B2 | | 2/2006 | Hughes ...................... 341/161 |
| 7,009,549 | B1 | * | 3/2006 | Corsi ........................ 341/161 |
| 7,068,203 | B2 | * | 6/2006 | Maloberti et al. ........... 341/155 |
| 7,106,240 | B2 | * | 9/2006 | Cringean .................... 341/163 |
| 7,339,512 | B2 | * | 3/2008 | Gulati et al. ................ 341/172 |
| 7,414,564 | B1 | * | 8/2008 | Ali ............................ 341/161 |
| 7,612,700 | B2 | * | 11/2009 | Kawahito et al. ........... 341/161 |
| 7,623,051 | B2 | * | 11/2009 | Murden et al. ............. 341/120 |
| 7,633,423 | B2 | * | 12/2009 | Cho .......................... 341/161 |

OTHER PUBLICATIONS

Chiu, Yun, et al., "A 14-b 12-MS/s CMOS Pipeline ADC with over 100-dB SFDR", IEEE Journal of Solid-State Circuits, vol. 39, No. 12, Dec. 2004, pp. 2139-2151.
Sonkusale, Sameer, Background Digital Error Correction Technique for Pipelined Analog-Digital Converters, 2001 IEEE, Sep. 2001, pp. I-408 to I-411.

* cited by examiner

Primary Examiner—Linh V Nguyen
(74) Attorney, Agent, or Firm—Koppel, Patrick, Heybl & Dawson

(57) ABSTRACT

Pipelined converter systems include a plurality of converter stages in which some stages generate and pass a residue signal to a succeeding stage for further conversion. The generation of the residue signal can inject spurious charges into a reference source that is used in the generation. The spurious charges reduce the accuracy of the residue signal and the accuracy of the system. Residue generator embodiments are thereby formed to provide reduction charges to the reference source that are arranged to oppose and reduce the spurious charges. This reduction of spurious charges significantly enhances system accuracy and linearity.

20 Claims, 9 Drawing Sheets

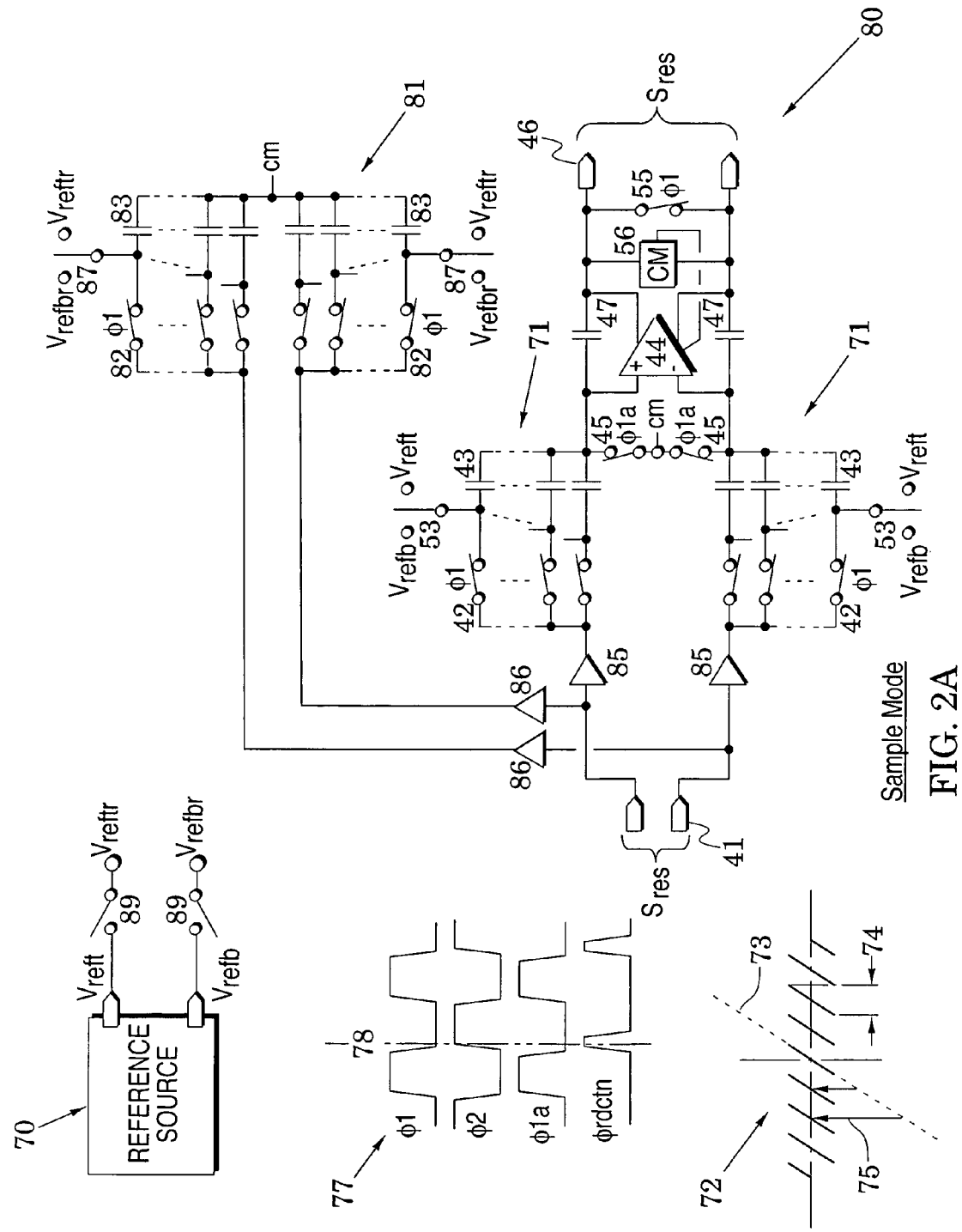
FIG. 2A Sample Mode

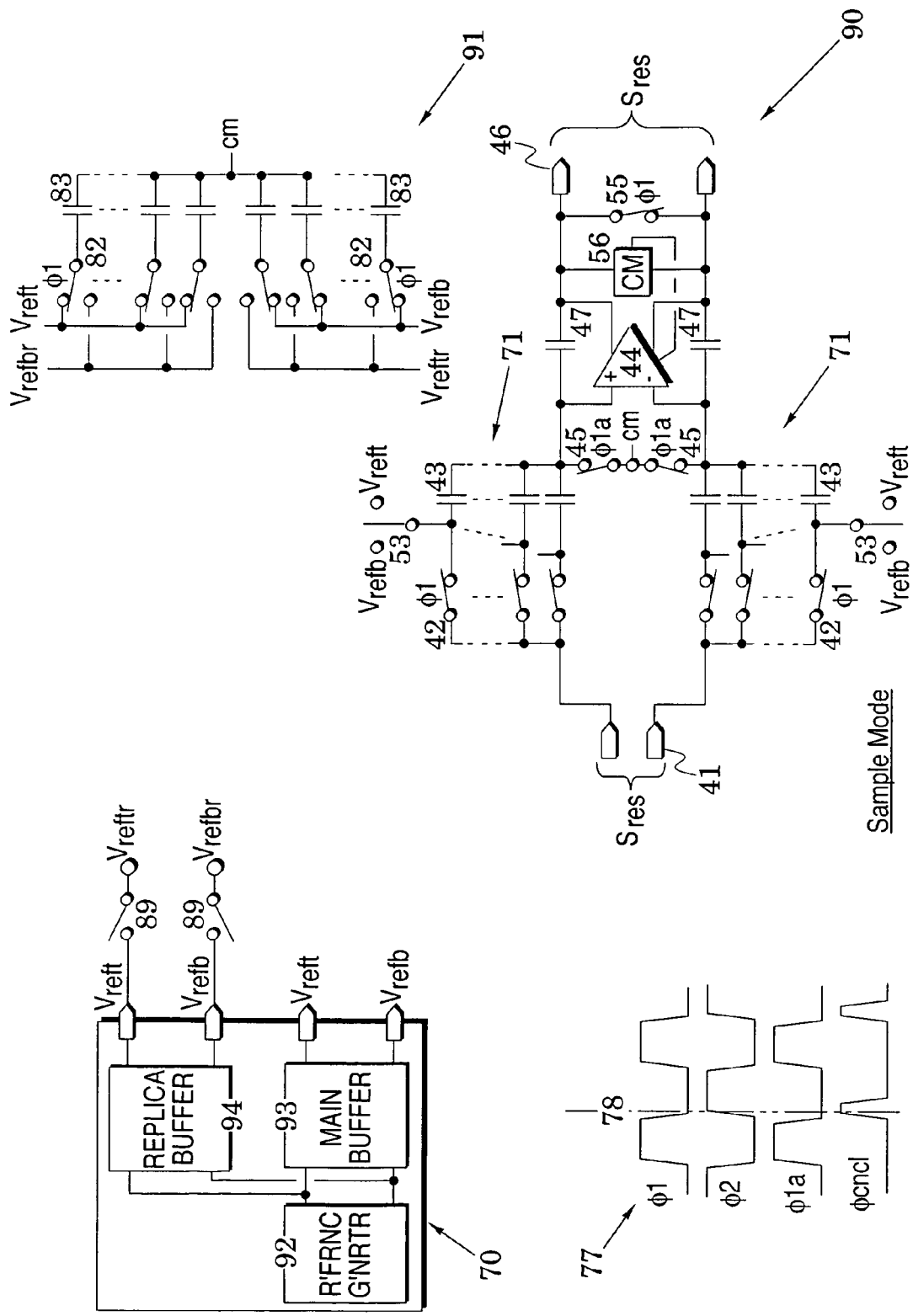
FIG. 3A Sample Mode

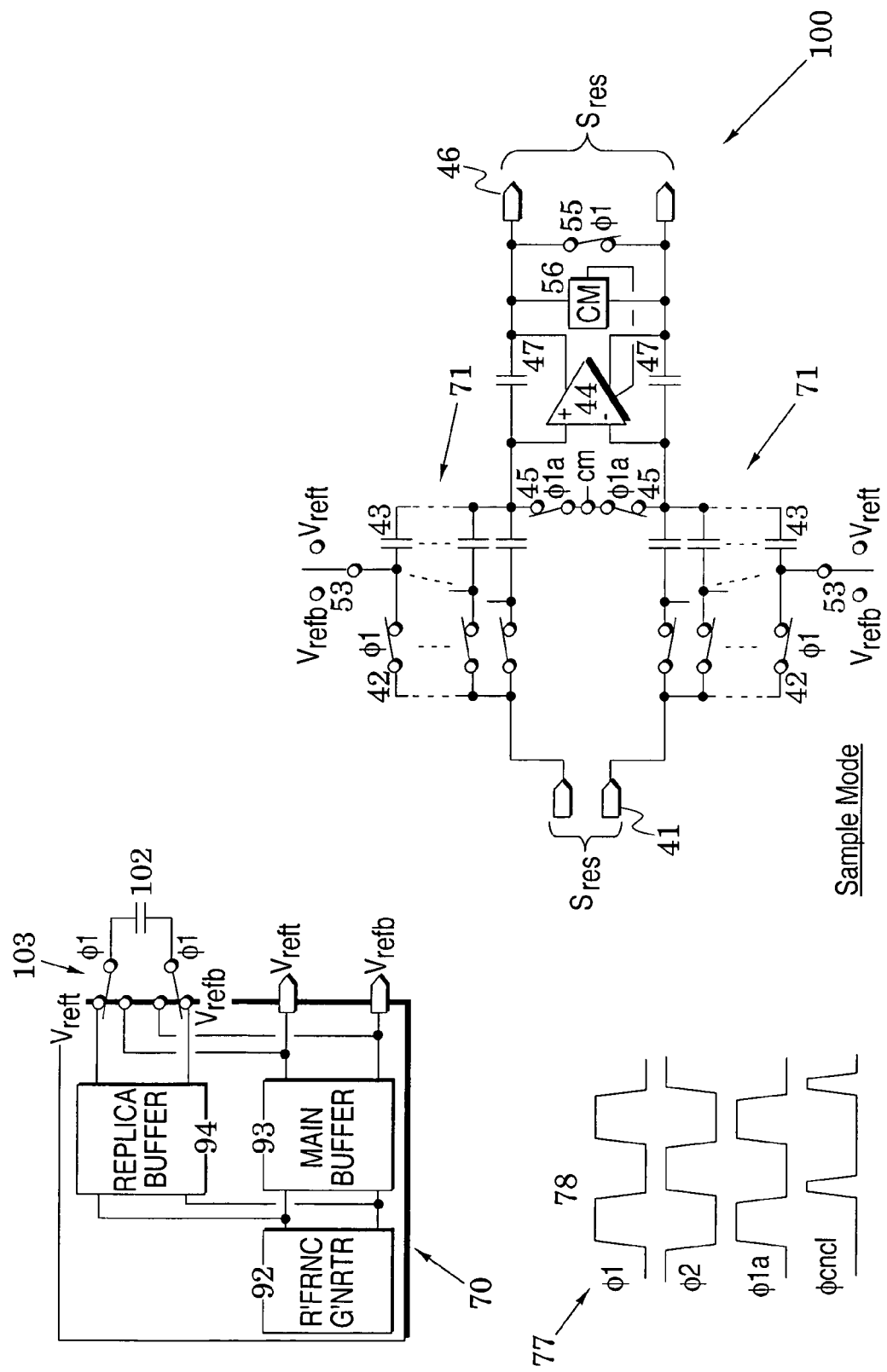
FIG. 4A  Sample Mode

Gain Mode

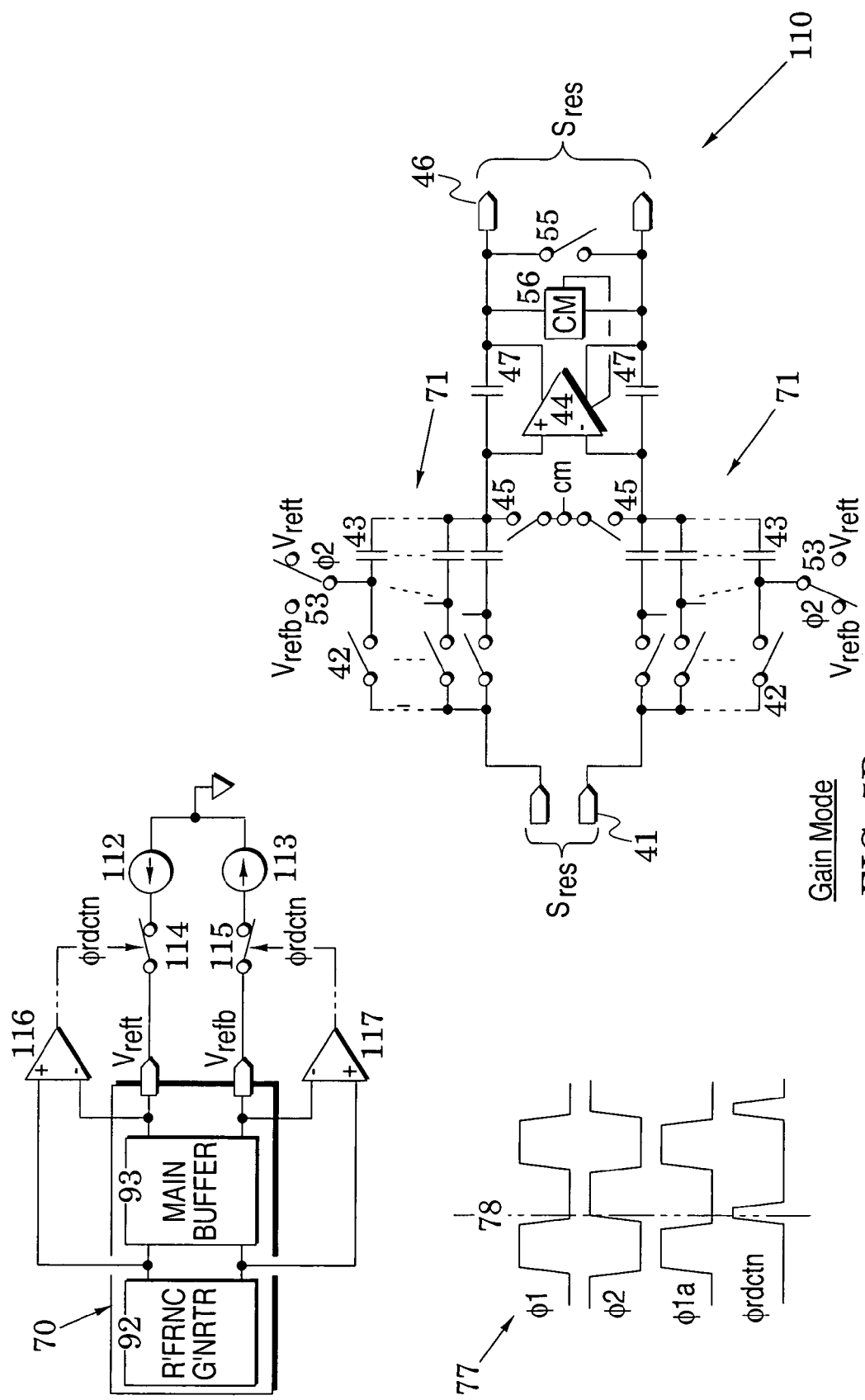
FIG. 5B  Gain Mode

US 7,728,752 B2

RESIDUE GENERATORS FOR REDUCTION OF CHARGE INJECTION IN PIPELINED CONVERTER SYSTEMS

BACKGROUND OF THE INVENTION

1. Field of the Invention

The present invention relates generally to pipelined converter systems.

2. Description of the Related Art

Pipelined analog-to-digital converter systems are capable of achieving impressive resolution and signal-to-noise performance at extremely high sample rates (e.g., 150 megasamples per second). Accordingly, they are useful in a wide range of demanding converter applications (e.g., charge-coupled device imaging, ultrasonic medical imaging, base station processing, digital receivers, digital video, cable modems, digital subscriber line systems, and Ethernet systems).

The speed of a pipelined system is realized by processing an analog input signal through a series of converter stages. Each stage provides a respective digital code and, except for the last stage, each also forms an analog residue signal which is passed to a succeeding stage for further conversion. The respective digital code is typically used to apply a selected one of a set of reference signals to switched-capacitor circuits to thereby generate the residue signal. Because the accuracy of the pipelined system is degraded by any error in the residue signals, their accurate generation is critical to the system.

BRIEF SUMMARY OF THE INVENTION

The present invention is generally directed to residue generator embodiments that reduce charge injection and thus enhance conversion accuracy in pipelined converter systems. The drawings and the following description provide an enabling disclosure and the appended claims particularly point out and distinctly claim disclosed subject matter and equivalents thereof.

BRIEF DESCRIPTION OF THE DRAWINGS

FIGS. 2A and 2B illustrate a residue generator embodiment for use in a converter system such as that of FIG. 1;

FIGS. 3A and 3B illustrate another residue generator embodiment for use in a converter system such as that of FIG. 1;

FIGS. 4A and 4B illustrate another residue generator embodiment for use in a converter system such as that of FIG. 1; and FIGS. 5A and 5B illustrate another residue generator embodiment for use in a converter system such as that of FIG. 1.

DETAILED DESCRIPTION OF THE INVENTION

FIGS. 1-5B are directed to residue generator embodiments for use in signal processing systems such as pipelined systems in which a residue generator of one converter stage provides a residue signal to a succeeding converter stage for further processing. It is important to reduce errors in the residue signal because these errors cannot be corrected and they, therefore; irretrievably degrade a conversion system's accuracy.

The disclosed residue generator embodiments recognize that spurious charges are injected into a system's reference source during operational modes of conventional residue generators and these spurious charges degrade the accuracy of the residue signal. With this recognition, residue generator embodiments are configured to provide reduction charges to the reference source that are arranged to oppose and reduce the spurious charges. This reduction of spurious charges significantly enhances system accuracy and linearity and can be used to ease requirements of the system's residue generator so that the system's speed and power can also be enhanced.

Figure 1:
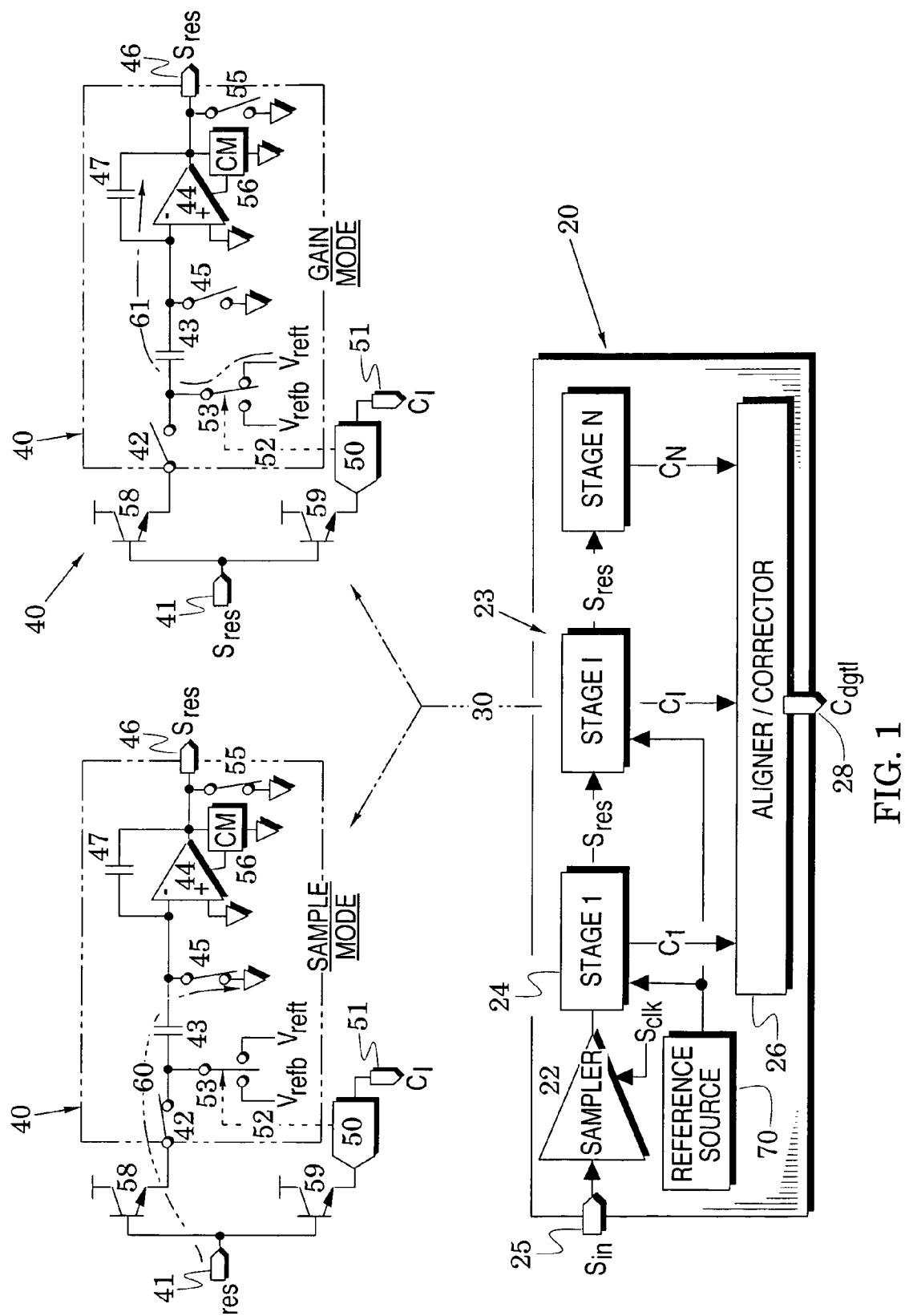
FIG. 1 includes a block diagram of a converter system embodiment and includes schematics that illustrate operational modes in an exemplary converter stage of the system.

To facilitate understanding of residue generator embodiments, attention is initially directed to the exemplary pipelined signal converter system in FIG. 1 which includes a sampler 22 that precedes a string 23 of pipelined converter stages 24. In response to clock signals $S_{clk}$, the sampler provides, to the string 23, successive samples of an analog input signal $S_{in}$ that is received at a system input port 25.

In response to each of the samples, the first of the converter stages provides a respective digital code $C_1$ and also generates a residue signal $S_{res}$ which is passed to the succeeding converter stage. Except for the Nth converter state, each succeeding converter stage processes a residue signal from the preceding converter stage into a respective digital code and provides a respective residue signal which is again passed to a succeeding converter stage. The last of the converter stages 24 processes a residue signal from the preceding converter stage into a respective digital code $C_N$.

Because the stages' digital codes are generated on successive clock signals but correspond to a respective one of the samples of the sampler 22, they must be temporally aligned in an aligner/corrector 26 which is also generally configured to use redundancy in the digital codes of the converter stages to correct conversion errors. From the temporally-aligned and corrected codes, the aligner/corrector 26 provides digital codes $C_{dgtl}$ at a system output port 28 that each corresponds to a respective one of the samples. Although the system 20 includes the sampler 22, it is noted that this converter element may be removed in other converter embodiments with its sampling function realized within the initial converter stage.

Example arrow 30 directs attention to elements in an exemplary one of the converter stages 24 which is shown in sample and gain operational modes. The converter stage includes a residue generator 40 and an analog-to-digital converter (DAC) 50 that each receive a residue signal $S_{res}$ (from a preceding converter stage) at an input port 41.

The residue generator 40 includes a first sample switch 42 and a sample capacitor 43 which are serially arranged between the converter input port 41 and the input of an amplifier 44. A second sample switch 45 is coupled to the input of the amplifier and the amplifier's output feeds a generator residue port 46 wherein an output capacitor 47 is coupled about the amplifier.

The input port 41 is also coupled to the DAC 50 which feeds a converter code port 51 and also provides a control signal 52 to control a reference switch 53 that couples to a junction between the first sample switch 42 and the sample capacitor 43. In response to the control signal 52, the reference switch 53 selects one of top and bottom reference voltages $V_{reft}$ and $V_{refb}$. Finally, an output switch 55 is coupled to the output of the amplifier 44 and a common-mode (CM) controller 56 provides common-mode control signals to the amplifier in response to the amplifier's output signals. In other stage embodiments, the first sample switch 42 and the DAC 50 may be preceded by signal isolation that is provided by buffer transistors 58 and 59. As shown in the converter system 20, the reference signals are provided to all but the last of the stages 24 by a reference source 70.

During each system clock cycle, the residue generator 40 operates in two successive operational modes to process a residue signal at the input port 41 that lies somewhere in an input window defined by the span $V_{ref}$ between the top and bottom reference voltages $V_{reft}$ and $V_{refb}$. Accordingly, FIG. 1 shows the residue generator in an initial sample mode and also in a succeeding gain mode.

In the sample mode, the second sample switch 45 and the output switch 55 short the input and output of the amplifier 44. The first sample switch 42 is also closed so that the residue signal $S_{res}$ at the input port 41 injects electrical charges along a charge path 60 into the sample capacitor 43. In response to the residue signal at the input port 41, the DAC 50 determines the proper $I_{th}$ digital code $C_1$ to be provided at the converter code port 51.

Based upon its decision of the proper digital code $C_1$, the DAC 44 sets the control signal 52 to select a reference signal in the gain operational mode. Thus a selected one of the top and bottom reference voltages $V_{reft}$ and $V_{refb}$ is applied to the sample capacitor 45 to thereby transfer electrical charges along a transfer path 61 from the sample capacitor 43 into the output capacitor 47. This charge transfer generates the residue signal $S_{res}$ at the output port 46 for subsequent processing by the succeeding one of the converter stages 24.

The selection of the proper reference voltage is based on the digital code decision of the DAC 44 and is made so that the selected reference voltage directs the conversion of succeeding converter stages to the portion of the system's transfer function that is occupied by the analog input signal $S_{in}$. In addition to directing succeeding conversion to a proper portion of the system's transfer function, the selected reference signal also causes the output residue signal to be "gained up" so that the full selection window $V_{ref}$ is again presented for processing by the succeeding converter stage.

Figure 2B:
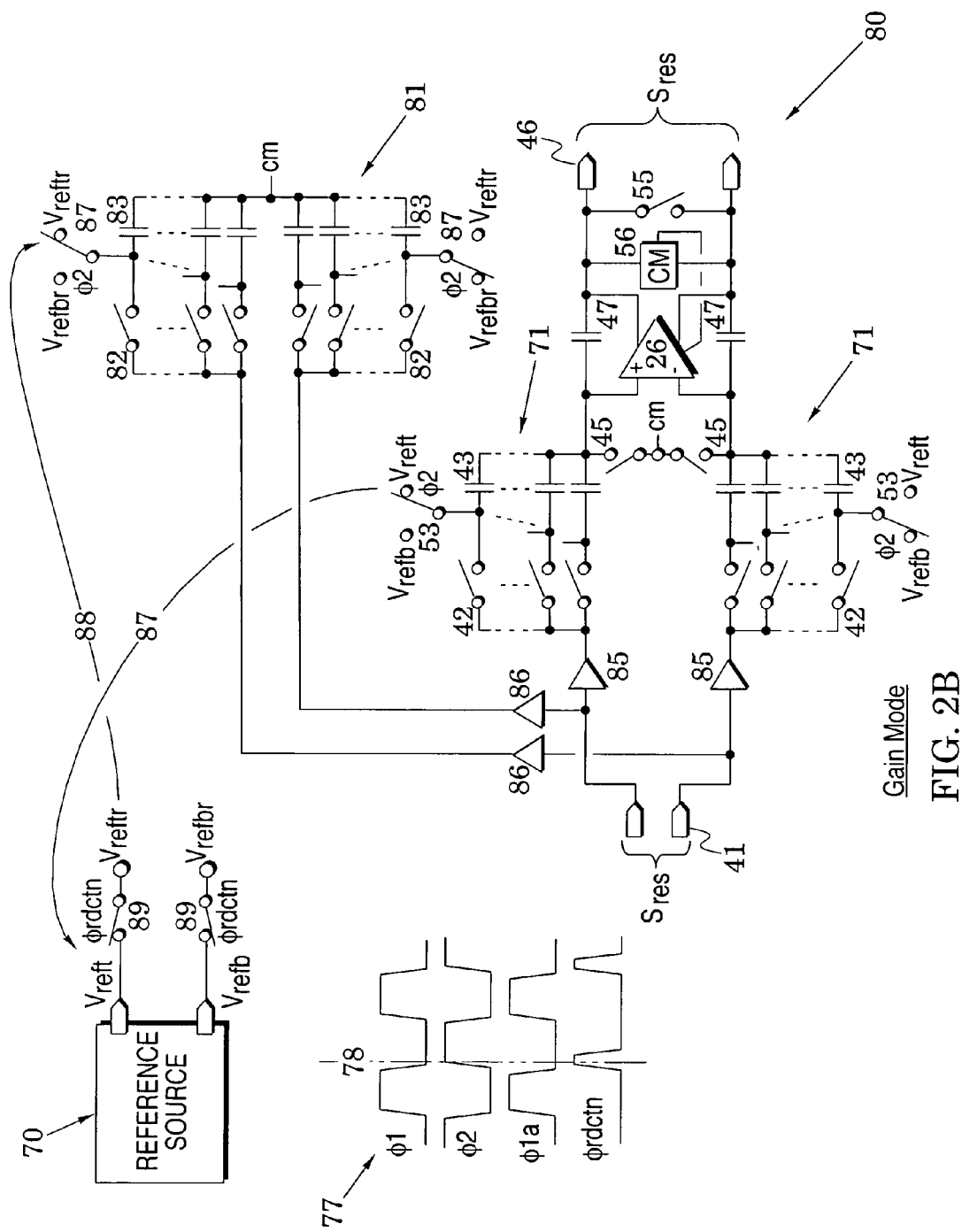

Attention is now directed to FIGS. 2A and 2B which illustrate a differential embodiment 80 of the residue generator 40 of FIG. 1. The residue generator 80 includes elements of the generator 40 with like elements indicated by like reference numbers. In addition to being arranged in a differential arrangement, the residue generator 80 includes upper and lower sets 71 of sample capacitors 43 and first sample switches 42. The number of capacitors and switches required is determined by the number of bits being processed through the converter stage that contains the residue generator 80.

For example, FIG. 2A shows a transfer function 72 of a 3-bit residue generator. The slope of a broken line 73 indicates that this transfer function needs a gain of four to provide a proper "gained-up" output residue signal. For this embodiment, therefore, each of the upper and lower sets 71 should contain four sample capacitors 43 and first sample switches 42. The transfer function 72 also shows that each transfer-function subrange 74, other than the central subrange, must be offset by multiples of the span $V_{ref}$ between the top and bottom reference voltages $V_{reft}$ and $V_{refb}$ as indicated by exemplary arrows 75.

For example, the subrange just left of the central subrange must be offset upward by $V_{ref}$. This is accomplished by coupling one of the first sample capacitors 43 at one input of the differential amplifier 44 to the top reference voltage $V_{reft}$ and coupling one of the first sample capacitors 43 at the other input of the differential amplifier to the bottom reference voltage $V_{refb}$. This process would be reversed for the subrange just right of the central subrange. Subranges further from the central subrange must be offset further which requires that additional ones of the first sample capacitors 43 are coupled to appropriate reference voltages. The resultant transfer function 72 indicates why residue generators such as the generator 80 are often referred to as multiplying digital-to-analog converters (MDACs).

In the sample mode of FIG. 2A, the first and second sample switches 42 are closed in accordance with a clock φ1 of a set 77 of clock signals so that the first sample capacitors 43 take on an input charge from the residue signal at the input port 41. The second sample switches 45 are closed in accordance with a clock φ1a which, as indicated by a vertical broken line 78, opens slightly early to more accurately set the sample received in the sample capacitors 43.

In the gain mode of FIG. 2B, reference switches 53 respond to clock φ2 in the set 77. It is assumed in the figures that the input signal to the residue generator 80 is in the subrange just left of the central subrange in the transfer function 72 so that a single upper one of the sample capacitors 43 is coupled through a reference switch 53 to the top reference voltage $V_{reft}$ of the reference source 70 and a single lower one of the sample capacitors 43 is coupled through a reference switch 53 to the bottom reference voltage $V_{refb}$.

Although this setting of the reference switches 53 will properly obtain an output residue signal in accordance with the subrange just left of the central subrange in the transfer function 72, it is recognized that it will also inject spurious charges into the reference generator. For example, a spurious charge is injected from the upper sample capacitor 43 into the top reference voltage $V_{reft}$ of the reference source 70 as indicated by a charge arrow 86. It is further recognized that the amplitude of this spurious charge will be input dependent (i.e., it will be a function of the input residue signal at the input port 41). This spurious charge can disturb the accuracy of the top reference voltage $V_{reft}$ and this will degrade the accuracy of the output residue signal at the output port 46.

In accordance with this recognition, the residue generator 80 is configured to provide reduction charges, as indicated by a charge arrow 87 in FIG. 2B, to the reference source 70 that oppose and thus reduce the spurious charges to thereby enhance the accuracy of the output residue signal. The reduction charges are obtained with a charge injector configured to provide reduction charges to the source in the gain mode to reduce spurious charges injected through the main switch network. In particular, a charge injector 81 is formed with replica capacitors 83 and injector switch networks of replica switches 82 that are arranged to substantially mimic the upper and lower sets 71 of sample capacitors 43 and first sample switches 42.

In the sample mode of FIG. 2A, the replica capacitors 83 receive reduction charges from the residue signal at the input port 41. The insertion of input charges into the sample capacitors 43 and insertion of reduction charges into the replica capacitors 83 is preferably isolated by buffers 84 and 85 (e.g., similar to the buffer transistors 58 and 59 in FIG. 1). In other embodiments, the buffers 85 may be coupled to the outputs rather than the inputs of the buffers 84.

In the gain mode of FIG. 2B, appropriate ones of reference switches 88 are closed in accordance with the clock φ2 of the set 77 to direct reduction charges to reduction switches 89. The reduction switches are then closed in accordance with the reduction clock φrdctn to thereby provide reduction charges to the reference source 70 as indicated by the charge arrow 87. It is noted that the buffers 84 and 85 are arranged so that the reduction charge in any of the replica capacitors 83 is opposite the input charge in a corresponding one of the sample capacitors 43. That is, the sample and replica capacitors are arranged so that they are oppositely coupled to the input signal.

Therefore, the reduction charges will substantially reduce the spurious charges so that disturbance of the top and bottom reference voltages $V_{reft}$ and $V_{refb}$ is significantly reduced. The reduction of the disturbance is further reduced because the reduction charges received into the replica capacitors 83 are input dependent just as are the input charges received into the sample capacitors 43.

It is noted that the reduction clock φrdctn occupies an initial portion of the φ2 clock. The location and extent of this portion is preferably adjusted so that the spurious charges are significantly reduced by the reduction charges without substantially affecting the transfer of the input charges of the sample capacitors to the output capacitors 47 to thereby generate the output residue signal.

It is further noted that the connection between the reference and reduction switches 88 and 89 is facilitated with the use of notations $V_{reftr}$ and $V_{refbr}$ in FIGS. 2A and 2B. These notations indicate the flow of reduction charges and do not represent actual voltages. For example, the notation at each end of the charge arrow 87 indicates that the top reference voltage $V_{reft}$ is coupled to appropriate ones of the replica capacitors 83 during the brief period of the reduction clock φrdctn. It is apparent that the reference and reduction switches 88 and 89 can be altered (e.g., combined) in other residue generator embodiments. For example, the reduction switches 89 can be multiport switches which include the directing functions of the reference switches 88.

Figure 3B:
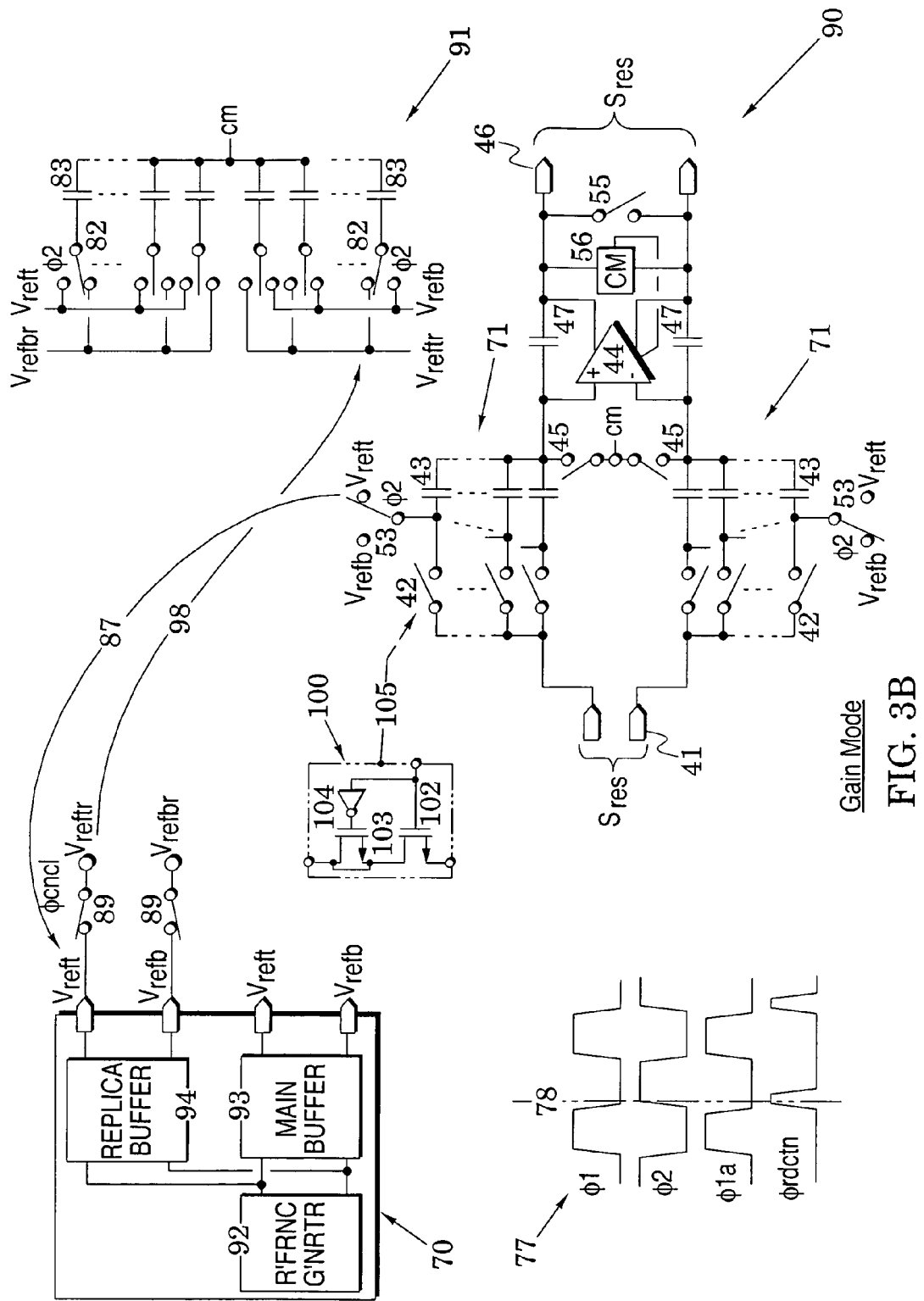

FIGS. 3A and 3B illustrate another residue generator 90 which includes elements of the reference generator 80 of FIGS. 2A and 2B with like elements indicated by like reference numbers. In contrast, however, the charge injector 81 has been rearranged as a charge injector 91. The buffers 85 and reference switches 88 have been removed and the replica switches 82 have been altered so that they can couple the replica capacitors 83 to the top and bottom reference voltages $V_{reft}$ and $V_{refb}$ in the sample mode of FIG. 3A and momentarily couple selected ones of the replica capacitors 83 to the top and bottom reference voltages $V_{reft}$ and $V_{refb}$ in the gain mode of FIG. 3B.

In addition, the reference source 70 is shown as an embodiment in which a reference generator 92 generates the top and bottom reference voltages $V_{reft}$ and $V_{refb}$ and main and replica buffers 93 and 94 provide the top and bottom reference voltages $V_{reft}$ and $V_{refb}$ at reference output ports. The main buffer 93 provides them to the reference switches 53 and, to lighten loading on this buffer, the replica buffer 94 provides them to the reduction switches 89.

In the sample mode of FIG. 3A, each of an upper set of the replica capacitors 83 is coupled through replica switches 82 to receive reduction charges from one of the top and bottom reference voltages and each of an lower set of the replica capacitors 83 is coupled through replica switches 82 to receive reduction charges from the other of the top and bottom reference voltages.

In the gain mode of FIG. 3B, the replica switches 82 couple selected ones of the replica capacitors to the reduction switches 89. If only one of the sample capacitors 43 is coupled to the top reference voltage $V_{reft}$, for example, then one of the replica capacitors 83 that was previously coupled to the opposite bottom reference voltage $V_{refb}$, is now coupled through a reduction switch 89 to the top reference voltage $V_{reft}$.

When any one of the sample capacitors 43 is coupled to a reference, it will inject a spurious charge into, for example, the top reference voltage $V_{reft}$ of the reference source 70 as indicated by the charge arrow 86. However, a corresponding one of the replica capacitors 83 was previously coupled to the opposite bottom reference voltage $V_{refb}$ so that it can inject a reduction charge to oppose the spurious charge during the period of the reduction clock φrdctn as indicated by the charge arrow 98 in FIG. 3B.

In other embodiments of the reference generator 80, the replica capacitors 83 can be sized to thereby adjust the magnitude of the reduction charge so that it better matches and reduces the spurious charge. This adjustment of the reduction charge may also be improved by appropriate alteration of the duration of the reduction clock φrdctn.

As discussed above, spurious charges are applied to the reference source 70 when the sample capacitors 43 are suddenly coupled to the source by the first sample switches 42. Another significant portion of the spurious charge is contributed by clock feedthrough in the first sample switches 42. These switches form a main switch network that is generally realized with a plurality of metal-oxide-semiconductor transistors. When clock signals are applied to the gates of these transistors, spurious pulses feed through to the transistors' current terminals at the clock transitions and these spurious pulses are conducted to the reference source 70 to be part of the spurious charge.

As shown in FIG. 3B, an improved switch 100 for the main switch network can be formed with a first transistor 102 and a second transistor 103 wherein both current terminals of the second transistor are coupled to one current terminal of the first transistor. In addition, the gates of the first and second transistors are fed with opposite-polarity signals so that if the gate of the first transistor receives a switch command, the gate of the second transistor will receive the inverse of the switch command. The switching action of the first transistor 102 is not altered as the current terminals of the second transistor are always shorted together. In one switch embodiment, the inverse switch command can be generated with an inverter 104.

If each of the first sample switches 42 is replaced by the improved switch (as indicated by replacement arrow 105), each spurious pulse that is generated by the first transistor 102 will be accompanied by an opposite-polarity spurious pulse from the second transistor 103. These spurious pulses will, therefore, tend to cancel and the spurious charges applied to the reference source 70 will tend to decrease. The second transistor 103 can be sized to adjust the magnitude of its spurious pulses so that they better match and reduce the spurious pulses from the first transistor 102.

Figure 4B:
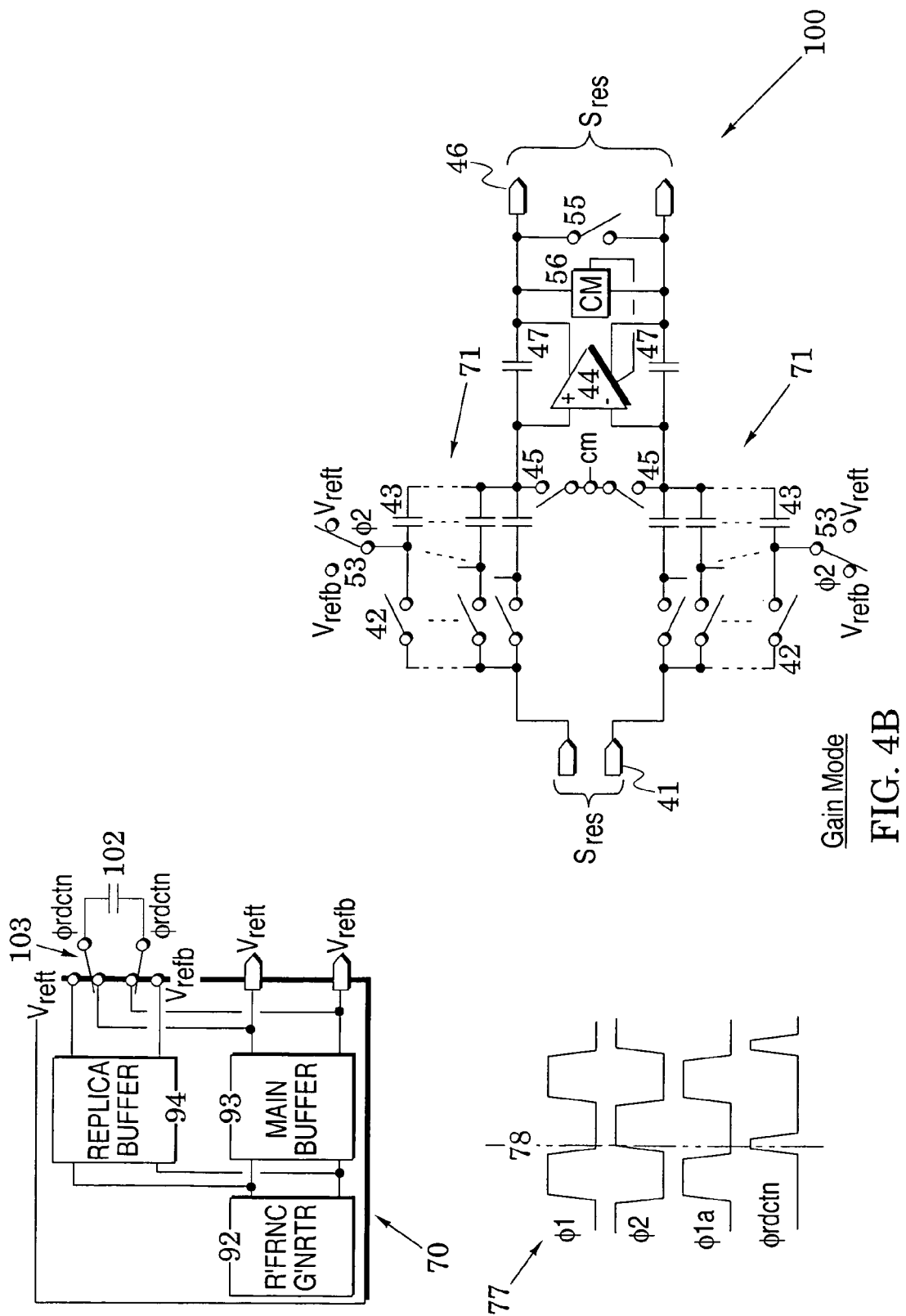

FIGS. 4A and 4B illustrate another residue generator 110 which includes elements of the reference generator 90 of FIGS. 3A and 3B with like elements indicated by like reference numbers. In the residue generator 100, the charge injector 91 of FIG. 3A is replaced by a charge injector formed by an injector capacitor 102 with associated injection switches 103.

In the sample mode of FIG. 4A, the injection switches are switched in accordance with the clock reduction clock φ1 so that the injector capacitor is coupled across the top and bottom reference voltages $V_{reft}$ and $V_{refb}$. A total charge of $C_{inj} V_{ref}$ is thus established in the injector capacitor 112 wherein $C_{inj}$ is the capacitance of this capacitor. In the gain mode of FIG. 4B, the injection switches 113 are switched in accordance with the reduction clock φrdctn so that the injector capacitor is momentarily coupled across the main buffer 93.

Accordingly, the injector capacitor 112 can apply a reduction charge to oppose and reduce the spurious charges in an initial portion of the sample mode. Disturbances due to the spurious charge will be reduced and will slowly settle out. The size of the injector capacitor and the duration of the reduction clock φrdctn can be adjusted to enhance these effects.

Figure 5A:
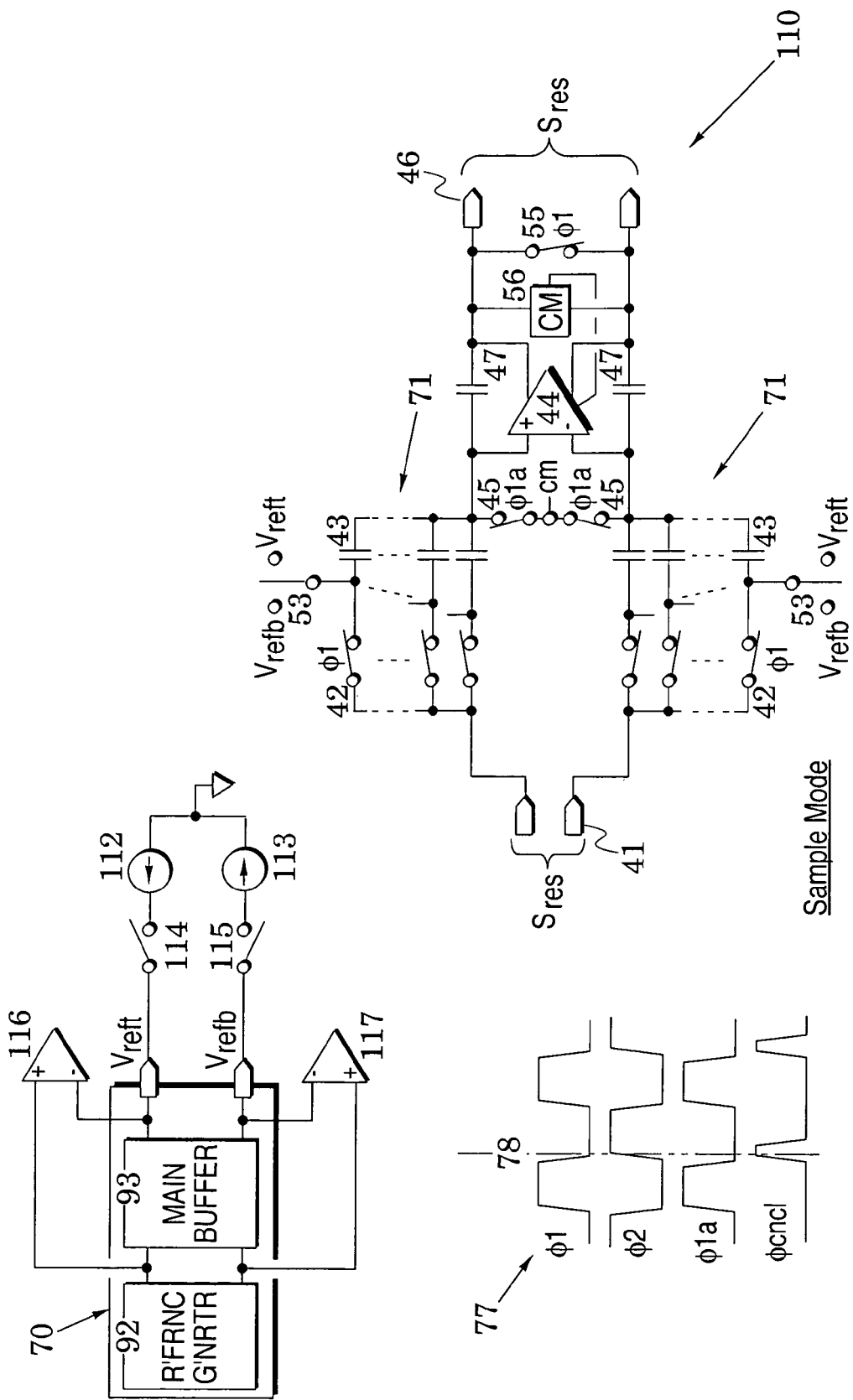

FIGS. 5A and 5B illustrate another residue generator 120 which includes elements of the reference generator 110 of FIGS. 4A and 4B with like elements indicated by like reference numbers. In the residue generator 120, the injector capacitor 112 and associated injection switches 113 are replaced by current sources 122 and 123, reduction switches 124 and 125, and first and second comparators 126 and 127.

The reference generator 92 provides initial reference voltages and the main buffer 93 provides the top and bottom reference voltages $V_{reft}$ and $V_{refb}$ in response to the initial reference voltages. Because the main buffer is not perfect (e.g., it does not have zero output impedances), the top and bottom reference voltages may differ from the initial reference voltages (from the reference generator 92) when the reference source 70 is providing charging currents to the sample capacitors 43.

The first and second comparators 126 and 127 are arranged to provide switch commands in response to these differences and the reduction switches 124 and 125 couple the current sources 122 and 123 to the main buffer 93 in response to the switch commands. The switch commands will generally be restricted to the initial portion of the gain mode, i.e., they will occur in accordance with the reduction clock φrdctn.

The currents from the current sources 122 and 123 can be adjusted and the duration of the reduction clock φrdctn can be adjusted to provide reduction charges that oppose and reduce the spurious charges which occur when the voltages across the main buffer 93 differ from those across the reference generator 92.

Words such as inject, injected and injection have been used above to describe the flow of spurious and reduction charges. These words are not meant to imply a specific direction (e.g., into an element) but, rather, to indicate an alteration of an element's total charge. In general, the flow of the reduction charges is arranged to oppose and reduce the flow of the spurious charges.

The inventive embodiments described herein are exemplary and numerous modifications, variations and rearrangements may achieve substantially equivalent results and are intended to be embraced in the appended claims.

We claim:

1. A residue generator arranged to process an input signal into an output residue signal in sample and gain operational modes, comprising:
   an amplifier;
   at least one sample capacitor;
   a reference source to provide first and second reference voltages;
   a main switch network configured to:
      couple said sample capacitor to receive an input charge from said input signal in said sample mode; and
      couple said sample capacitor between a selected one of said reference voltages and said amplifier in said gain mode to thereby generate said residue signal; and
   a charge injector configured to provide reduction charges to said reference source in said gain mode to reduce spurious charges injected in said reference source through said main switch network.

2. The generator of claim 1, further including an output capacitor coupled about said amplifier to support said residue signal.

3. The generator of claim 1, wherein said charge injector includes:
   at least one replica capacitor; and
   an injector switch network configured to:
      couple said replica capacitor to receive a reduction charge from said input signal in said sample mode; and
      couple said replica capacitor to a selected one of said reference voltages to enable said reduction charge to oppose said spurious charges in at least a portion of said gain mode.

4. The generator of claim 3, wherein said portion is an initial portion of said gain mode.

5. The generator of claim 3, wherein said main and injector switch networks oppositely couple said sample and replica capacitors to said input signal in said sample mode.

6. The generator of claim 1, wherein said charge injector includes:
   at least one replica capacitor; and
   an injector switch network configured to:
      couple said replica capacitor to receive, in said sample mode, a reduction charge from one of said reference voltages; and
      couple said replica capacitor to a selected one of said reference voltages to enable said reduction charge to oppose said spurious charges in at least a portion of said gain mode.

7. The generator of claim 6, wherein said injector switch network couple said replica capacitor to different ones of said reference voltages in said sample and gain modes.

8. The generator of claim 6, further including a buffer inserted between said reference source and said injector switch network to provide said reduction charge.

9. The generator of claim 6, wherein said portion is an initial portion of said gain mode.

10. The generator of claim 1, wherein said charge injector includes:
    an injector capacitor; and
    an injector switch network configured to:
       couple said injector capacitor to receive a reduction charge from said reference source in said sample mode; and
       couple said injector capacitor to said selected reference voltage to enable said reduction charge to oppose said spurious charge in at least a portion of said gain mode.

11. The generator of claim 10, further including a buffer inserted between said reference source and said injector switch network to provide said reduction charge.

12. The generator of claim 1, wherein said main switch network includes a plurality of switches in the form of first transistors that each have a control terminal for receiving a switch command and wherein said charge injector includes:
    a plurality of second transistors that each has its current terminals coupled to a current terminal of a respective one of said first transistors and has a control terminal for receiving the inverse of said switch command.

13. The generator of claim 12, further including an inverter arranged to provide said inverse.

14. The generator of claim 1, wherein said reference source includes:
    a reference generator; and
    a main buffer that provides said reference voltages at first and second buffer ports in response to said reference generator;
    and wherein said charge injector includes:
    first and second current sources;
    first and second comparators that provide switch commands in response to voltage differences across said main buffer in at least a portion of said gain mode; and an injector switch network arranged to couple each of said current sources to a respective one of said buffer ports in response to said switch commands.

15. A signal converter system that provides a digital code which corresponds to an analog input signal, comprising:

a pipelined arrangement of converter stages configured to provide said digital code in response to said analog input signal; and a residue generator in at least one of said stages arranged to process an input signal into an output residue signal for a succeeding one of said stages in sample and gain operational modes with first and second reference voltages from a reference source wherein said residue generator includes:

an amplifier;

an output capacitor across said amplifier;

at least one sample capacitor;

a reference source to provide first and second reference voltages;

a main switch network configured to:

couple said sample capacitor to receive an input charge from said input signal in said sample mode; and couple said sample capacitor between a selected one of said reference voltages and said amplifier in said gain mode to thereby generate said residue signal; and a charge injector configured to provide reduction charges to said reference source in said gain mode to reduce spurious charges injected in said reference source through said main switch network.

16. The system of claim 15, wherein said charge injector includes:

at least one replica capacitor; and an injector switch network configured to:

couple said replica capacitor to receive a reduction charge from said input signal in said sample mode; and couple said replica capacitor to a selected one of said reference voltages to enable said reduction charge to oppose said spurious charges in at least a portion of said gain mode.

17. The system of claim 15, wherein said charge injector includes:

at least one replica capacitor; and an injector switch network configured to:

couple said replica capacitor to receive, in said sample mode, a reduction charge from one of said reference voltages; and couple said replica capacitor to a selected one of said reference voltages to enable said reduction charge to oppose said spurious charges in at least a portion of said gain mode.

18. The system of claim 15, wherein said charge injector includes:

an injector capacitor; and an injector switch network configured to:

couple said injector capacitor to receive a reduction charge from said reference source in said sample mode; and couple said injector capacitor to said selected reference voltage to enable said reduction charge to oppose said spurious charge in at least a portion of said gain mode.

19. The system of claim 15, wherein said main switch network includes a plurality of switches in the form of first transistors that each have a control terminal for receiving a switch command and wherein said charge injector includes:

a plurality of second switches that each has its current terminals coupled to a current terminal of a respective one of said first transistors and has a control terminal for receiving the inverse of said switch command.

20. The system of claim 15, wherein said reference source includes:

a reference generator; and a main buffer that provides said reference voltages at first and second buffer ports in response to said reference generator;

and wherein said charge injector includes:

first and second current sources;

first and second comparators that provide switch commands in response to voltage differences across said main buffer in at least a portion of said gain mode; and an injector switch network arranged to couple each of said current sources to a respective one of said buffer ports in response to said switch commands.

* * * * *